(12) United States Patent
Yoda

(10) Patent No.: US 7,741,878 B2
(45) Date of Patent: Jun. 22, 2010

(54) SEMICONDUCTOR INTEGRATED CIRCUIT WITH LEAKAGE CURRENT SUPPRESSED

(75) Inventor: Kenichi Yoda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 278 days.

(21) Appl. No.: 11/907,212

(22) Filed: Oct. 10, 2007

(65) Prior Publication Data
US 2008/0087920 A1    Apr. 17, 2008

(30) Foreign Application Priority Data
Oct. 11, 2006   (JP) .............................. 2006-277591

(51) Int. Cl.
*H03K 19/08* (2006.01)
*G05F 3/02* (2006.01)

(52) U.S. Cl. ........................... 326/101; 326/83; 327/544

(58) Field of Classification Search ................. 326/101, 326/31, 34, 83; 327/544, 185; 365/227
See application file for complete search history.

(56) References Cited

U.S. PATENT DOCUMENTS 5,614,847 A * 3/1997 Kawahara et al. ............. 326/98
6,049,245 A * 4/2000 Son et al. .................... 327/544

FOREIGN PATENT DOCUMENTS

JP    2004-186666    7/2004

* cited by examiner

*Primary Examiner*—Daniel D Chang
(74) *Attorney, Agent, or Firm*—McGinn IP Law Group, PLLC

(57) ABSTRACT

In a semiconductor integrated circuit, a cell arrangement area is provided on a semiconductor substrate to allow a plurality of basis cells to be arranged. A basic power supply line is provided in an upper layer than the cell arrangement area to supply a power. A switch cell is configured to control the power supply from the basic power supply line to an inside of the cell arrangement area. An always operating cell is arranged in the cell arrangement area adjacently to the switch cell, and is configured to receive the power from the switch cell even when the switch cell stops the power supply to the cell arrangement area.

20 Claims, 11 Drawing Sheets

SEMICONDUCTOR INTEGRATED CIRCUIT WITH LEAKAGE CURRENT SUPPRESSED

BACKGROUND OF THE INVENTION

1. Field of the Invention

The present invention relates to a semiconductor integrated circuit, and more particularly, to a technique for suppressing a leakage current in a semiconductor integrated circuit. Japanese Patent Application No. 2006-277591 also relates to the semiconductor integrated circuit. The disclosure of this application is incorporated herein by reference.

2. Description of Related Art

A problem of increase in leakage current becomes important with advancement of a technique for miniaturization of a semiconductor device. The leakage current flowing unnecessarily occupies a larger portion of a total of power consumption of the semiconductor device. In order to suppress the increasing of this power consumption, various techniques are proposed in Japanese Laid Open Patent Application (JP-P2004-186666A).

FIG. 1 is a circuit diagram showing a configuration of a semiconductor device 100 described in JP-P2004-186666A. The semiconductor device 100 is related to an MT-CMOS (Multi Threshold CMOS). Referring to FIG. 1, in the semiconductor device 100, an N-channel transistor Q1 with a high threshold voltage is arranged between a higher side power supply line Vdd and a pseudo higher side power supply line Vddv. A power source terminal of a load circuit 101 is connected to the pseudo higher side power supply line Vddv and includes N-channel transistors (Q4 and Q5) with a low threshold voltage and P-channel transistors (Q2 and Q3) with a low threshold voltage.

In this way, by controlling a signal PCNT supplied to a gate of the N-channel transistor Q1 with a high threshold voltage, a leakage current of the load circuit 101 is reduced. In this technique, the load circuit 101 is provided in a specific area (for example, a functional block), and a power source for the load circuit 101 is supplied. As described above, the technique is known, in which a switch is arranged between the specific area and the power supply line to control the supply of the power when s supply of the power and blockage of the supply of the power to a certain specific area are switched.

In case of mixed existence of an area for which power supply can be blocked off (hereinafter, to be referred to as a blockade-possible area) and an area for which power is constantly supplied (hereinafter, to be referred to as an always-operating area), it is preferable that respective areas are laid out independently. However, since presently widespread semiconductor integrated circuit usually have complexities in configuration and operation, a layout of independent allocation of the blockade-possible area and the always-operating area is very difficult. For example, there is often a case that the constant operation area must be allocated in the blockade-possible area. In this case, the power supply line for the constant operation area is required to be achieved via an upper layer of the blockade-possible area. As a result, since the configuration of the semiconductor integrated circuit is complicated due to a multi-layer structure, so that manufacturing costs and working steps thereof will be increased.

SUMMARY

In a first embodiment of the present invention, a semiconductor integrated circuit includes a cell arrangement area provided on a semiconductor substrate to allow a plurality of basis cells to be arranged; a basic power supply line provided in an upper layer than the cell arrangement area to supply a power; a switch cell configured to control the power supply from the basis power supply line to an inside of the cell arrangement area; and an always operating cell arranged in the cell arrangement area adjacently to the switch cell, and configured to receive the power from the switch cell even when the switch cell stops the power supply to the cell arrangement area.

In a second embodiment of the present invention, a semiconductor integrated circuit includes a semiconductor substrate; a cell arrangement area provided on the semiconductor substrate to allow a plurality of basis cells to be arranged; a basic power supply line provided in an upper layer than the cell arrangement area; a switch cell configured to connect the basis power supply line and power supply line end portions of a plurality of basis cells arranged in the cell arrangement area; and an always operating cell arranged in the cell arrangement area adjacently to the switch cell. The switch cell blocks the power supply from the basis power supply line to the cell arrangement area in response to a control signal, and the always operating cell configured to receive the power from the switch cell without dependence on an operation of the switch cell.

According to the present invention, when a semiconductor integrated circuit having an always-operating areas and blockade-possible areas in a mixed state is configured, a semiconductor integrated circuit which can appropriately operate with preventing wires from being complicated can be provided.

In addition, increasing of manufacturing costs and work units thereof can be suppressed by preventing wires of the semiconductor integrated circuit from being complicated.

BRIEF DESCRIPTION OF THE DRAWINGS

The above and other objects, advantages and features of the present invention will be more apparent from the following description of certain embodiments taken in conjunction with the attached drawings, in which.

DESCRIPTION OF THE PREFERRED EMBODIMENTS

Hereinafter, a semiconductor integrated circuit of the present invention will be described with reference to the attached drawings. In a present semiconductor integrated circuit, a circuit is formed by arranging a set of elements (hereinafter, to be referred to as a basic cell) in a specific area of a semiconductor substrate and by connecting these basic cells. Each of a plurality of the basic cells arranged on a cell arrangement area is independent and isolated from another basic cell.

Figure 1:
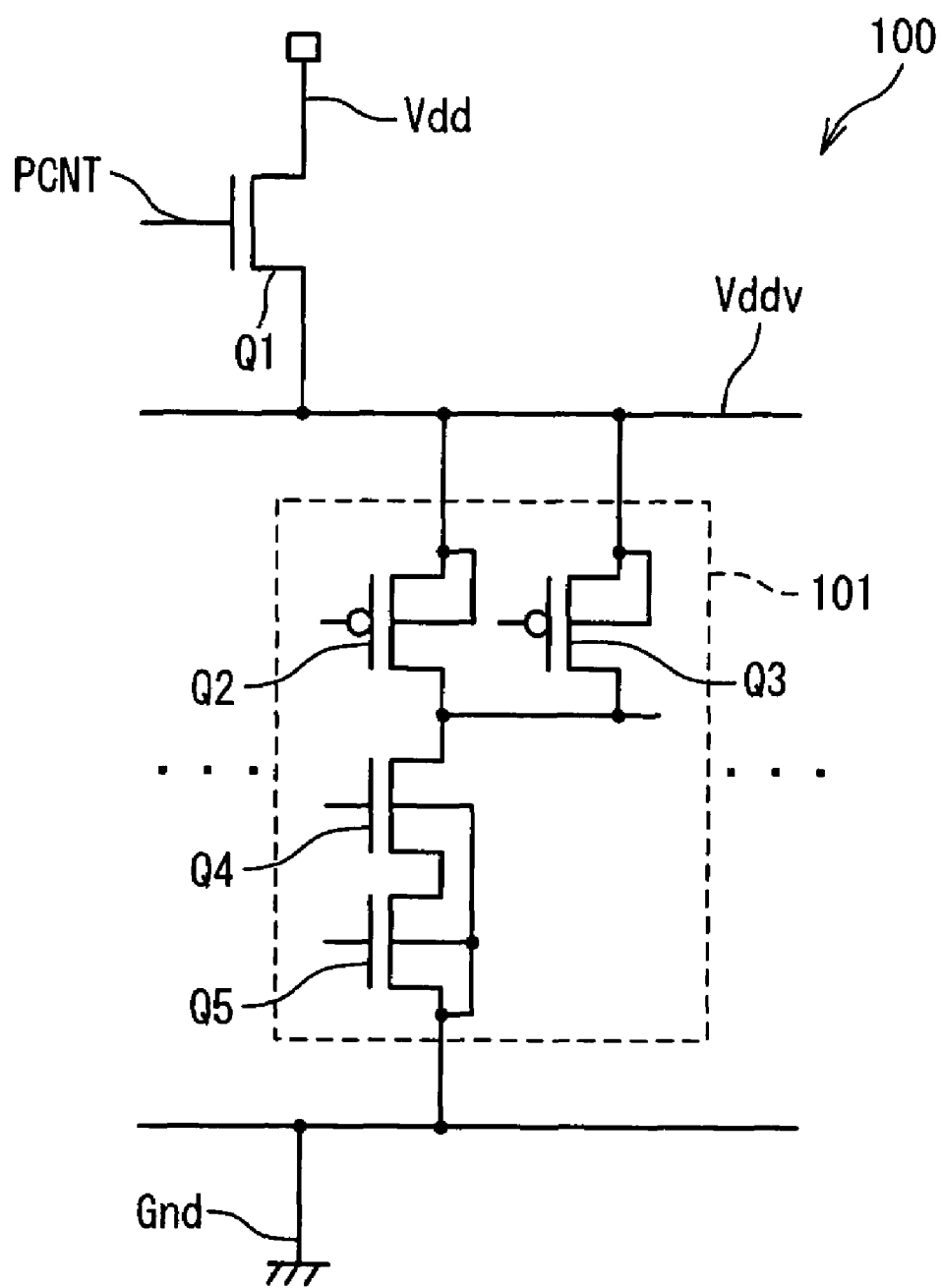
FIG. 1 is a circuit diagram showing a configuration of a semiconductor integrated circuit in a related art.
Figure 2:
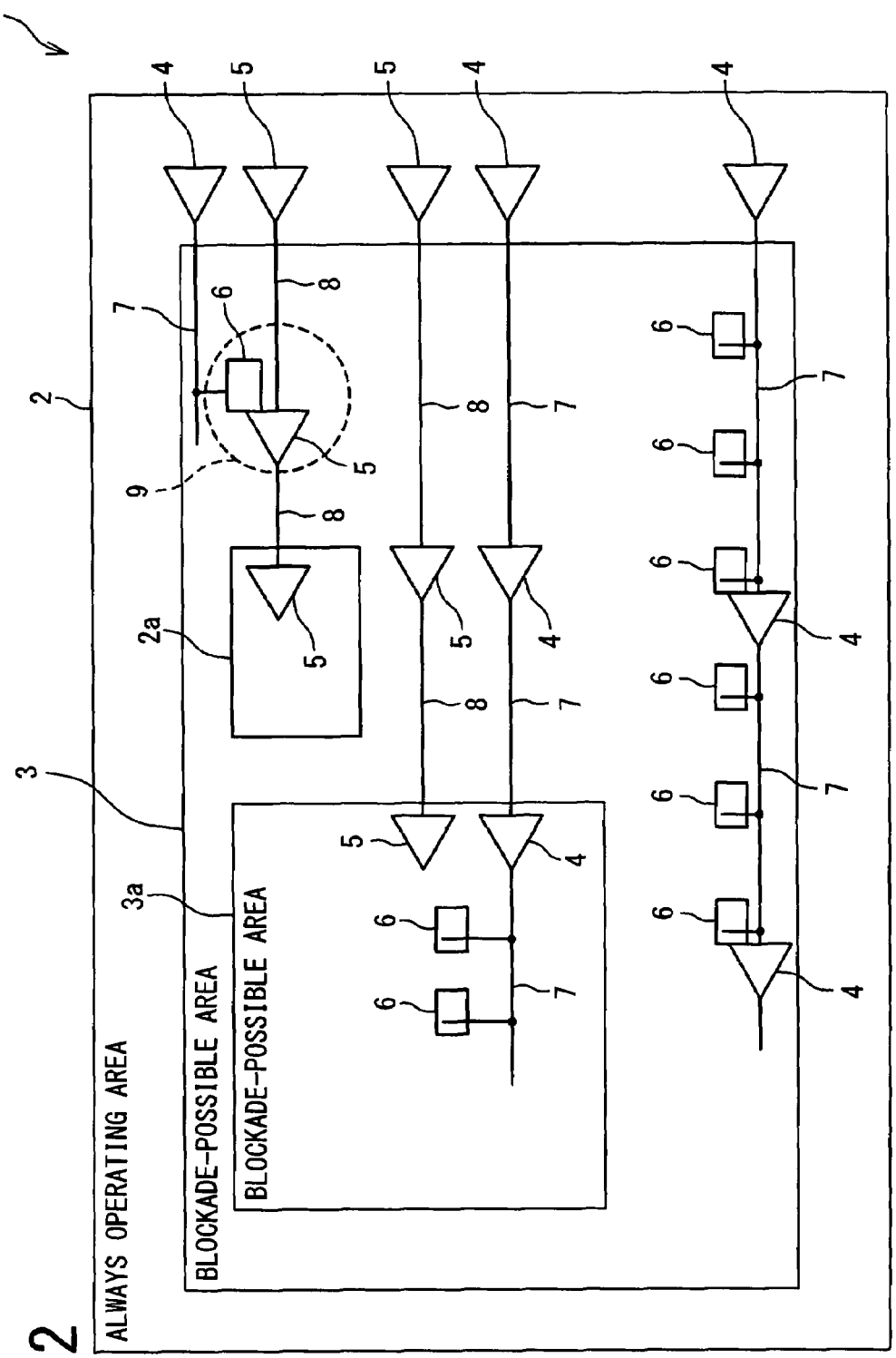
FIG. 2 is a block diagram exemplarily showing a configuration of a semiconductor integrated circuit according to an embodiment of the present invention.

FIG. 2 is a block diagram showing a configuration of a semiconductor integrated circuit 1 according to an embodiment of the present invention. The semiconductor integrated circuit 1 includes switching control signal transfer cells 4, signal transfer cells 5, and switching cells 6, and is configured of an always-operating area 2 and a blockade-possible area 3. The always-operating area 2 is an area to which a power is always supplied while the semiconductor integrated circuit 1 is operating. The blockade-possible area 3 is an area that the supply of the power to the area and the blockade of the power supply to the area are switched while the semiconductor integrated circuit 1 is in operation.

The switching control signal transfer cell 4 transfers a control signal for controlling supply of power to the blockade-possible area 3 and blockade of the power supply. Each of the switching control signal transfer cells 4 is connected to a control signal transfer line 7. The signal transfer cell 5 transfers a predetermined signal such as a data signal and an address signal to functional blocks provided in the semiconductor integrated circuit 1. Each of the signal transfer cells 5 is connected to a signal transfer line 8. The switching cell 6 is provided between a basic power supply line (not shown) for supplying a power and the blockade-possible area 3. The switching cell 6 is connected to the switching control signal transfer cell 4 via the control signal transfer line 7. The switching cell 6 operates in response to the control signal outputted from the switching control signal transfer cell 4.

Referring to FIG. 2, the semiconductor integrated circuit 1 in the present embodiment may include a plurality of the blockade-possible areas 3 and a plurality of the always-operating areas 2. For example, as shown in FIG. 2, the blockade-possible area 3 (hereinafter, to be referred to as a specific blockade-possible area 3a) may be further provided in the blockade-possible area 3 of the semiconductor integrated circuit 1. In addition, the always-operating area 2 (hereinafter, to be referred to as a specific always-operating area 2a) may be further provided in the blockade-possible area 3.

Referring to FIG. 2, to transfer a signal to a first signal transfer cell 5 in a specific always-operating area 2a, the first signal transfer cell 5 in the always-operating area 2a and a second signal transfer cell 5 in the always-operating area 2 are required to be connected each other. In this case, a high speed signal transfer can be realized by providing some signal transfer cells 5 between the first signal transfer cell 5 and the second signal transfer cell 5. When the specific always-operating area 2a is configured in the blockade-possible area 3, the signal transfer cell 5 allowing a high speed signal transfer is also provided in the blockade-possible area 3. When a signal is transferred via the signal transfer cell 5 provided in the blockade-possible area 3 e.g., a third signal transfer cell 5, the third signal transfer cell 5 is required to be in operation even when the power supply to the blockade-possible area 3 is blocked off.

A configuration of the signal transfer cell 5 provided for the blockade-possible area 3 will be described below. In the present embodiment, even when the power supply to the blockade-possible area 3 is blocked off, the signal transfer cell 5 (or the switching control signal transfer cell 4) must continuously operate, and the area of such a cell is not only an area 9 but also other areas. A circuit configuration described below also has a similar configuration in other areas providing the above-described signal transfer cell 5.

Figure 3:
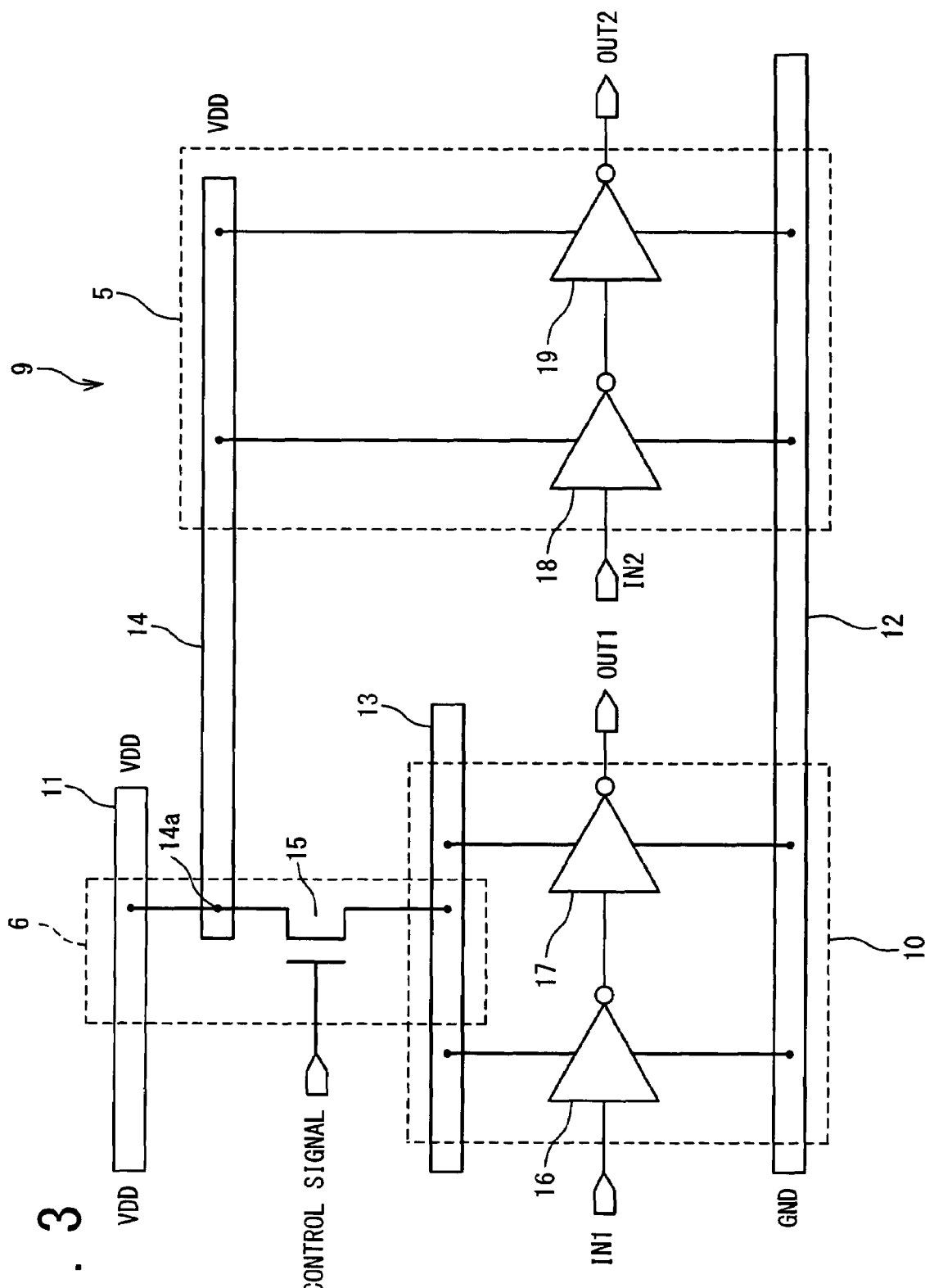
FIG. 3 is a circuit diagram exemplarily showing a configuration of an area 9 in FIG. 2.

FIG. 3 is a circuit diagram exemplarily showing a configuration of the area 9 in FIG. 2. Referring to FIG. 3, the area 9 includes the signal transfer cell 5, the switching cell 6, and a blockade-possible area cell 10. The blockade-possible area cell 10 is a cell for which the supply of power is blocked in response to an operation of the switching cell 6. The blockade-possible area cell 10 includes inverters 16 and 17, and they are connected in series. The signal transfer cell 5 includes inverter 18 and 19, and they are connected in series. A signal to be supplied to a specific always-operating area 2a is supplied to a second input signal terminal IN2 of the signal transfer cell 5, which is connected to an input of the inverter 18. In addition, a second output signal terminal OUT2 is connected to the signal transfer line 8 and transfers the signal supplied to the second input signal terminal IN2 to the specific always-operating area 2a via the signal transfer line 8.

In addition, the area 9 includes a master power supply line 11, a ground line 12, a power supply line 13 in the blockade-possible area, and an uncontrolled power supply line 14. The master power supply line 11 supplies a power outputted by a power supply unit (not shown) of the semiconductor integrated circuit 1. The ground line 12 provides a ground potential.

As shown in FIG. 3, the switching cell 6 includes a switching transistor 15. The switching transistor 15 controls the master power supply line 11 to be connected to or disconnected from the power supply line 13 in response to a control signal supplied to a gate electrode. When the switching transistor 15 is activated, the master power supply line 11 and the power supply line 13 are connected to each other and set to the same voltage. As mentioned above, in the present embodiment, the master power supply line 11 supplies a power supply voltage outputted from the power supply unit (not shown) of the semiconductor integrated circuit 1. Accordingly, when the switching transistor 15 is activated, a circuit whose power supply terminal is connected to the power supply line 13, i.e., the inverter 16 of the blockade-possible area cell 10 operates. Further, since the switching transistor 15 is inactivated, an operation of a circuit connected to the power supply line 13 stops. Based on this configuration, the switching cell 6 of the present embodiment controls power supply to the blockade-possible area 3.

Referring to FIG. 3, the area 9 includes the uncontrolled power supply line 14. The uncontrolled power supply line 14 is connected to the master power supply line 11 via a connection node 14a. As shown in FIG. 3, one power supply terminal of the inverter 18 of the signal transfer cell 5 is connected to the uncontrolled power supply line 14. Similarly, one power supply terminal of the inverter 19 is also connected to the uncontrolled power supply line 14. Thus, the signal transfer cell 5 can transfer the signal supplied into the second input signal terminal IN2 being independent of an operation of the switching transistor 15.

Figure 4:
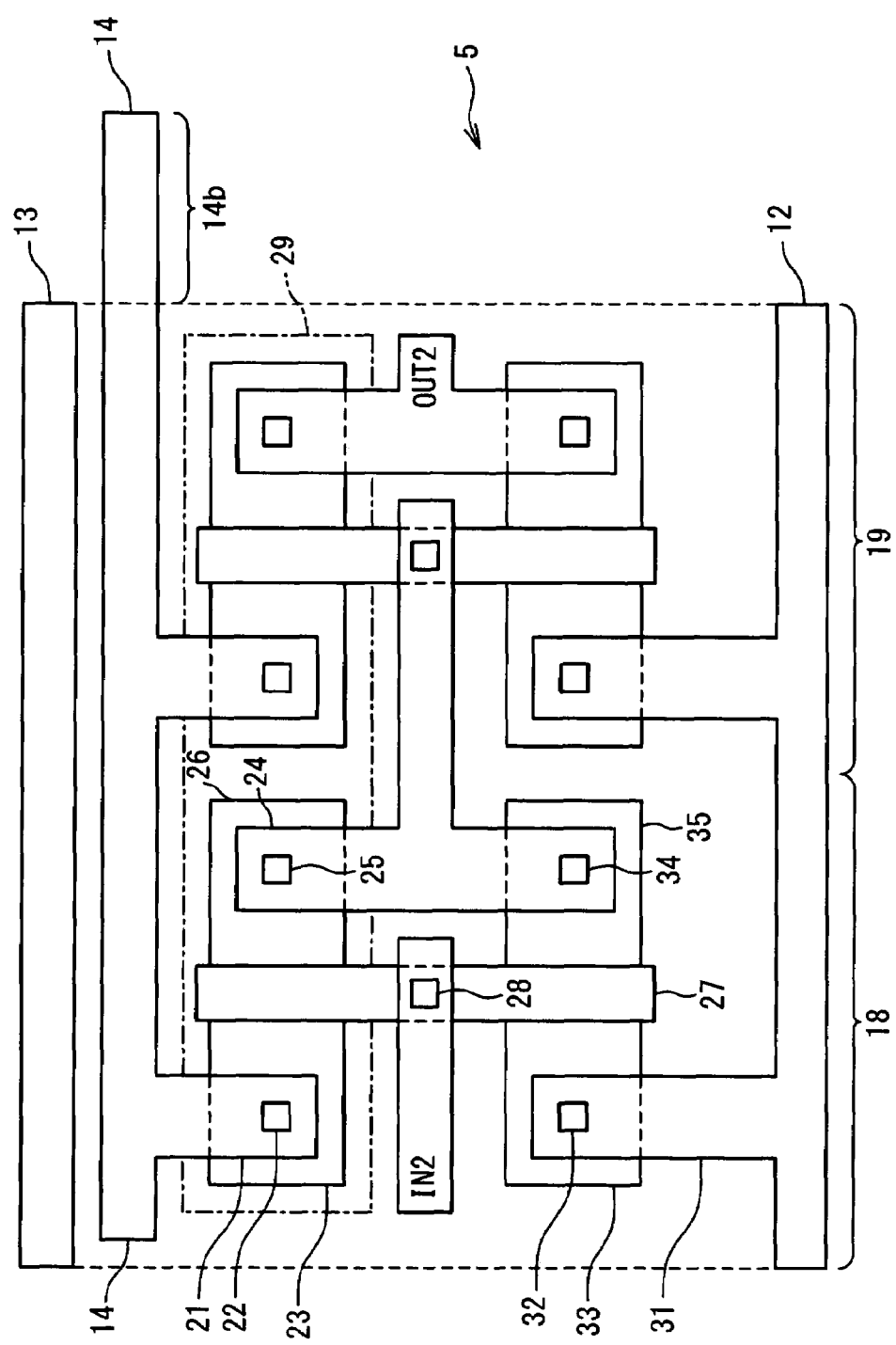
FIG. 4 is a layout pattern diagram exemplarily showing a configuration of a signal transfer cell 5 in FIG. 2.

The configuration of the above-mentioned signal transfer cell 5, switching cell 6, and blockade-possible area cell 10 will be described below in detail. FIG. 4 a layout pattern showing a configuration of the signal transfer cell 5 of the present embodiment. In the present embodiment, the inverters 18 and 19 of the signal transfer cell 5 have the same configuration. Accordingly, in the description described below, the configuration of the inverter 18 will be described mainly. Referring to FIG. 4, the inverter 18 of the signal transfer cell 5 included a P-channel MOS transistor and an N-channel MOS transistor.

The P-channel MOS transistor of the inverter 18 is formed in an N well 29 on a semiconductor substrate. In the N well 29, a diffusion layer 23 functioning as a source and a diffusion layer 26 functioning as a drain are formed. The diffusion layer 23 is connected to a power supply terminal portion 21 via a first contact 22. The power supply terminal portion 21 is connected to the uncontrolled power supply line 14. The diffusion layer 26 is connected to a gate electrode of the inverter 19 via a signal output terminal portion 24. In addition, the N-channel MOS transistor of the inverter 18 includes a diffusion layer 33 functioning as a source and a diffusion layer 35 functioning as a drain. The diffusion layer 33 is connected to a ground supply terminal portion 31 via a third contact 32, and the ground supply terminal portion 31 is connected to the ground line 12. The diffusion layer 35 is connected to a gate electrode of the inverter 19 via a contact 34.

As shown in FIG. 4, the signal transfer cell 5 of the present embodiment includes the uncontrolled power supply line 14, which is electrically isolated from the blockade-possible area power supply line 13. In addition, as shown in FIG. 4, when the signal transfer cell 5 is arranged, the uncontrolled power supply line 14 of the signal transfer cell 5 has a connection terminal 14b, i.e., a protruding portion into the adjacent cell from a boundary with the adjacent cell.

Figure 5:
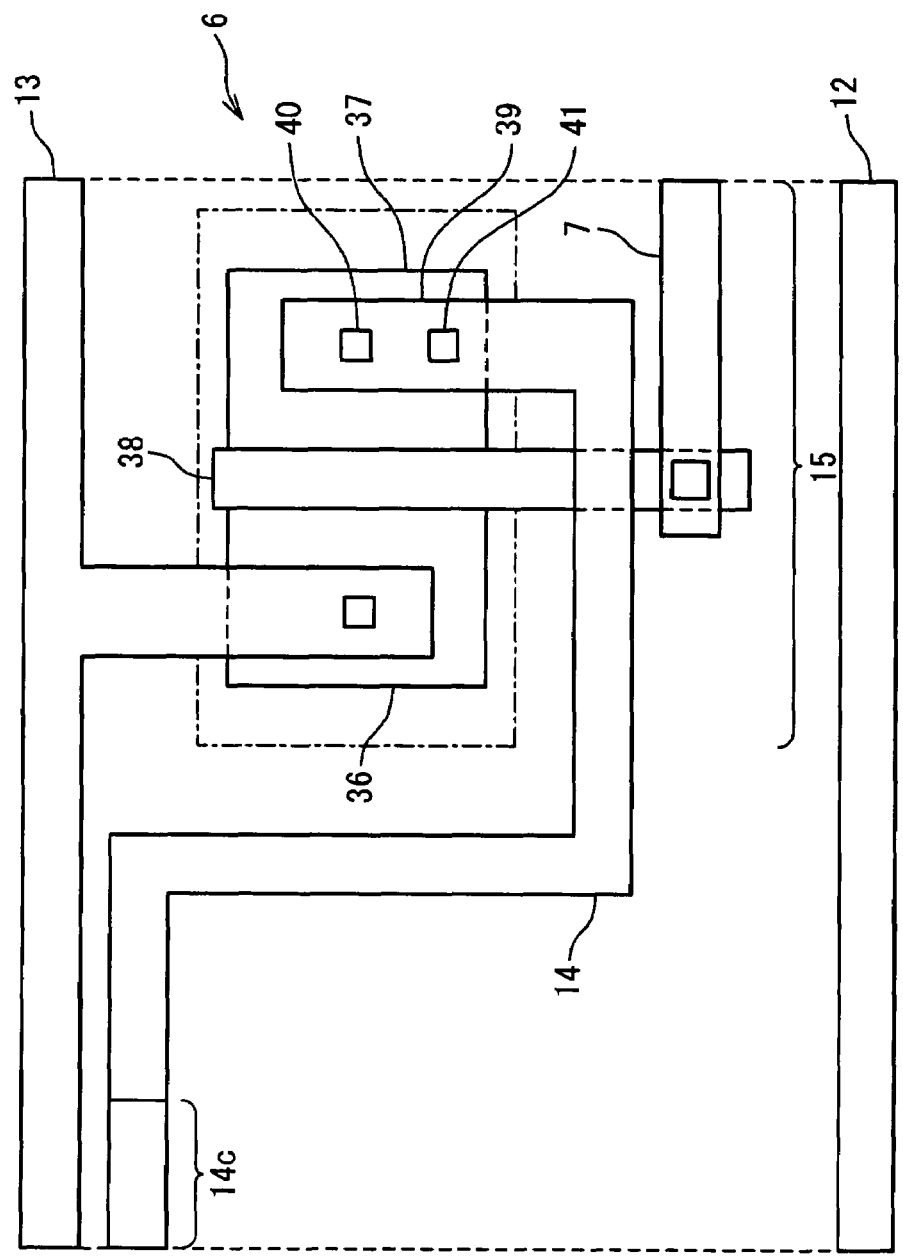
FIG. 5 is a layout pattern diagram exemplarily showing a configuration of a switching cell 6 in FIG. 2.

FIG. 5 is a layout pattern showing a configuration of the switching cell 6. As described above, the switching cell 6 includes the switching transistor 15. A case that the switching transistor 15 is a P-channel MOS transistor will be described below. Referring to FIG. 5, the switching transistor 15 of the switching cell 6 is formed in an N well in the substrate. The switching transistor 15 includes a diffusion layer 36 functioning as a drain, a diffusion layer 37 functioning as a source, and a gate electrode 38. A control signal is supplied to the gate electrode 38 via the signal transfer line 7.

As shown in FIG. 5, the uncontrolled power supply line 14 is included in the switching cell 6. The uncontrolled power supply line 14 is connected to a power supply line via a power supply terminal portion 39. The power supply terminal portion 39 is connected to a diffusion layer 37 via a contact 40. Here, the master power supply line 11 (not shown) is formed in an upper layer than the uncontrolled power supply line 14. The master power supply line 11 and the uncontrolled power supply line 14 are connected to each other via a connection contact 41. The connection contact 41 connects the power supplied from the master power supply line 11 to the power supply terminal 39. In addition, the power is supplied for the diffusion layer 37 via the contact 40.

Referring to FIG. 5, the uncontrolled power supply line 14 includes a connection terminal 14c. When the switching cell 6 is arranged, the connection terminal 14c is an extending portion from the boundary with an adjacent cell into this cell and corresponds to the above-mentioned connection terminal 14b.

When the switching transistor 15 is activated in response to the control signal supplied via the signal transfer line 7, the blockade-possible area power supply line 13 has the same voltage as the voltage supplied from the power supply line 14 via the power contact 40. When the switching transistor 15 is inactivated in response to the control signal, the power supplied to the blockade-possible area power supply line 13 is blocked.

Figure 6:
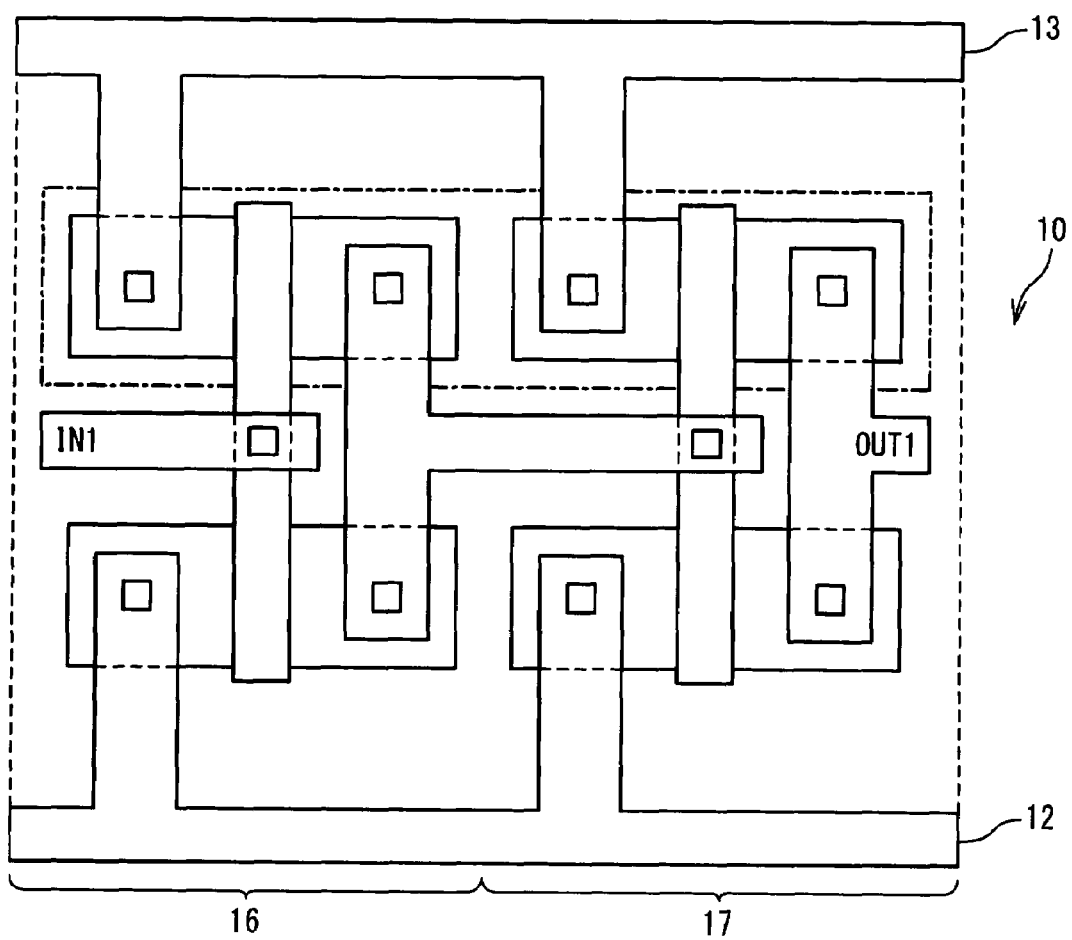
FIG. 6 is a layout pattern diagram exemplarily showing a configuration of the blockade-possible area cell 10 in FIG. 2.

FIG. 6 is a layout pattern exemplarily showing a configuration of the blockade-possible area cell 10. Referring to FIG. 6, the blockade-possible area cell 10 includes the inverters 16 and 17. The inverter 16 operates in response to a power supplied between the blockade-possible area power supply line 13 and the ground line 12. Similarly, the inverter 17 operates in response to the power supplied between the blockade-possible area power supply line 13 and the ground line 12.

Figure 7:
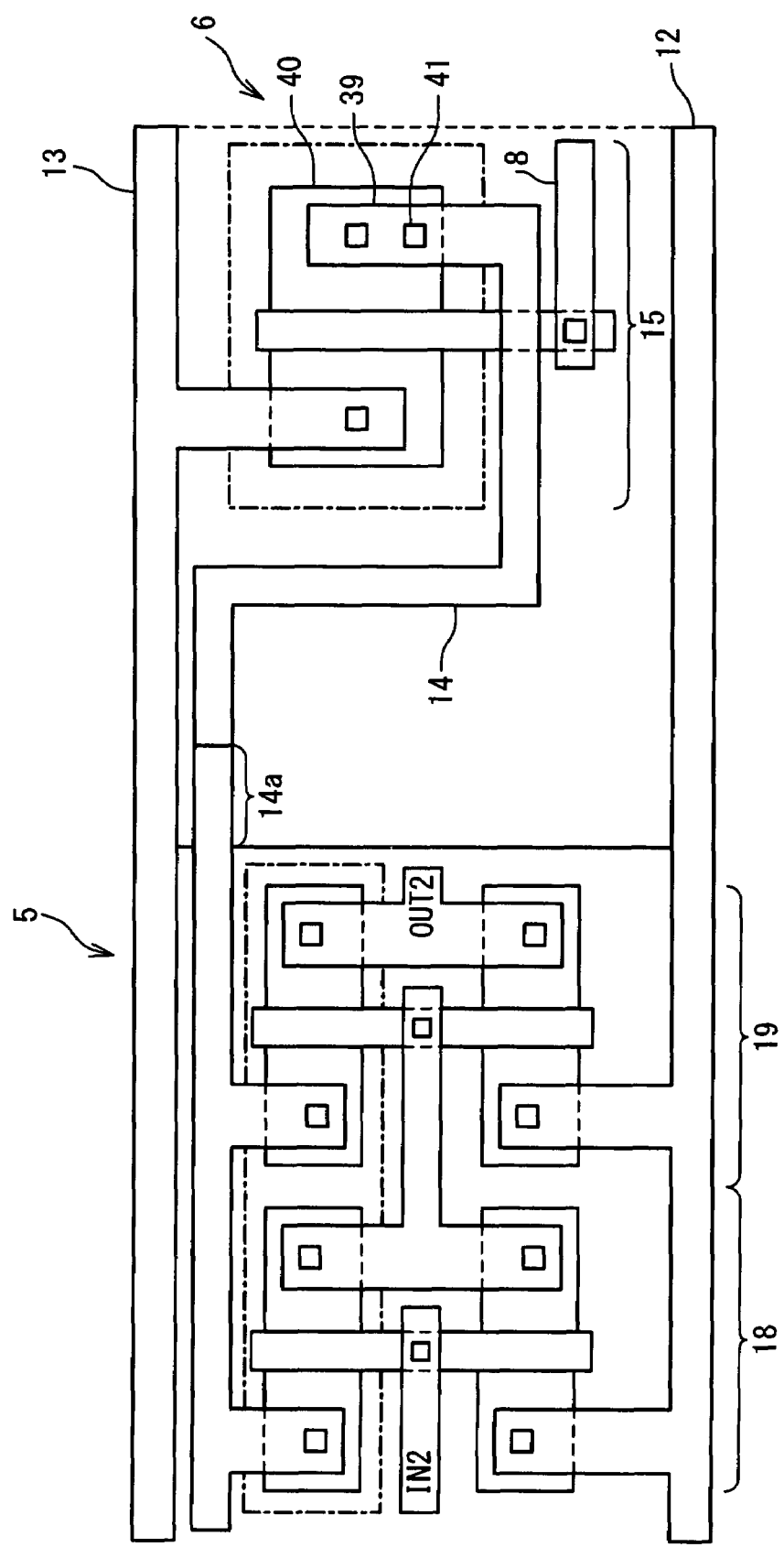
FIG. 7 is a layout pattern diagram when the signal transfer cell 5 and the switching cell 6 are arranged.

FIG. 7 is a layout pattern exemplarily showing a layout when the signal transfer cell 5 and the switching cell 6 are arranged in adjacent to each other. Referring to FIG. 7, the connection terminal 14b of the signal transfer cell 5 and the connection terminal 14c of the switching cell 6 are connected to each other as a connection terminal 14a. Thus, the uncontrolled power supply line 14 of the signal transfer cell 5 and the uncontrolled power supply line 14 of the switching cell 6 are connected to each other. For the uncontrolled power supply line 14 connected to the switching cell 6, the power from the master power supply line 11 (not shown) is always supplied via the connection contact 41.

Figure 8:
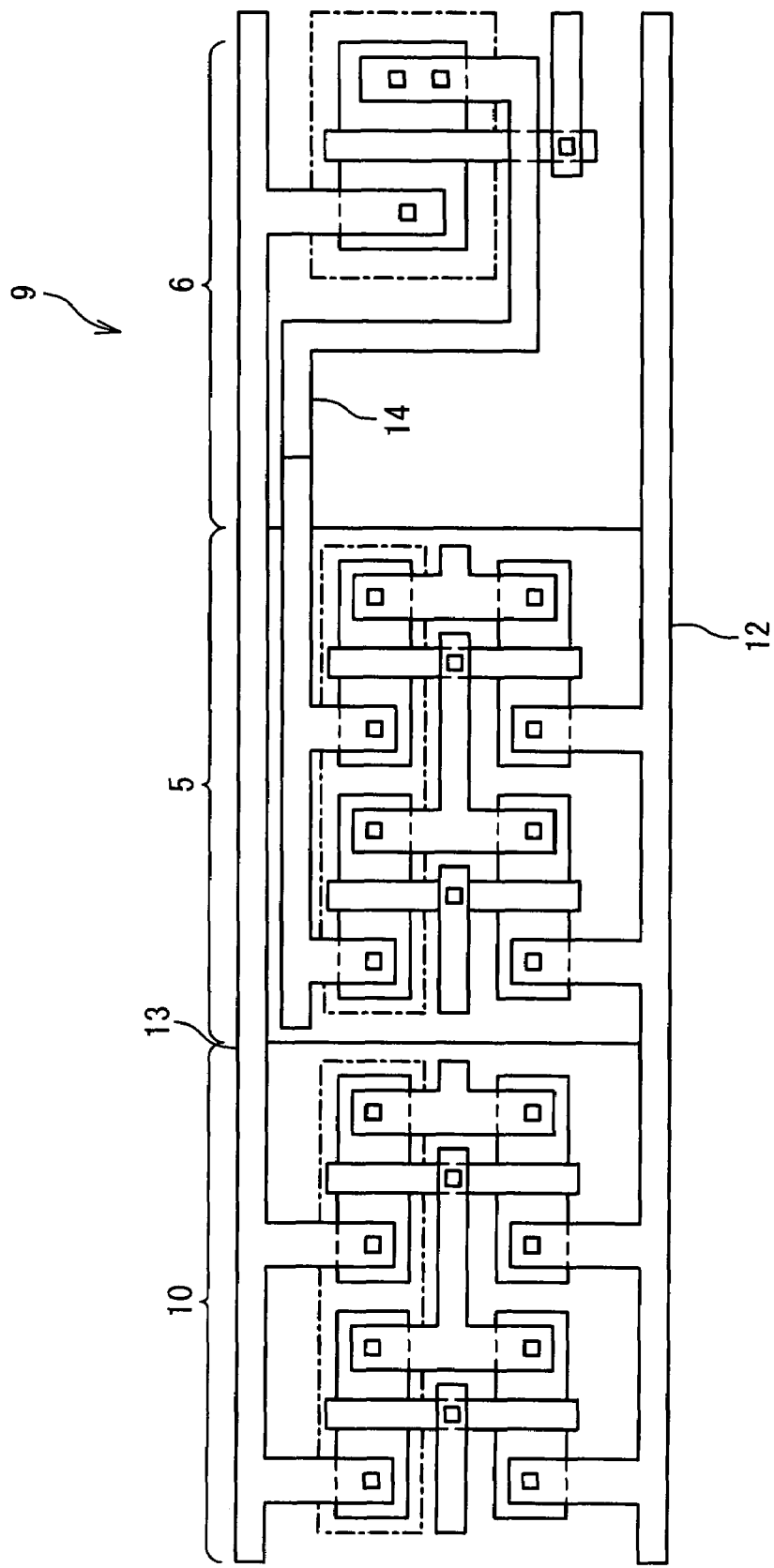
FIG. 8 is a layout pattern diagram when the blockade-possible area cell 10 is arranged adjacently to the signal transfer cell 5.

FIG. 8 is a layout pattern exemplarily showing a layout when the blockade-possible area cell 10 is arranged to be adjacent to the signal transfer cell 5. When the blockade-possible area cell 10 is arranged thus, the blockade-possible area power supply line 13 of the blockade-possible area cell 10 is connected to the blockade-possible area power supply line 13 of the switching cell 6 via the signal transfer cell 5. As described above, the signal transfer cell 5 of the present embodiment includes the blockade-possible area power supply line 13 independent from the uncontrolled power supply line 14. When the signal transfer cell 5 includes the blockade-possible area power supply line 13 independently from the uncontrolled power supply line 14, the blockade-possible area cell 10 adjacent to the signal transfer cell 5 can operate independently from the signal transfer cell 5. That is to say, even when the signal transfer cell 5 always operates, the switching cell 6 can control the power supply to the blockade-possible area cell 10 by the switching transistor.

Figure 9A:
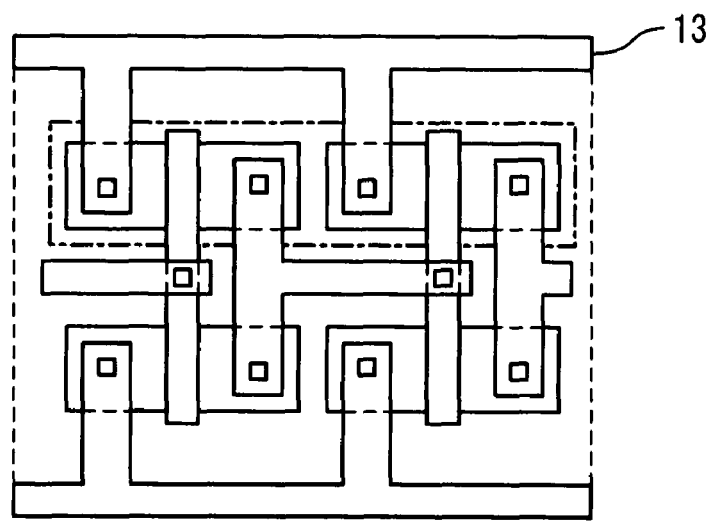
FIGS. 9A to 9D are layout pattern diagrams exemplarily showing a method of forming the signal transfer cell 5.
Figure 9B:
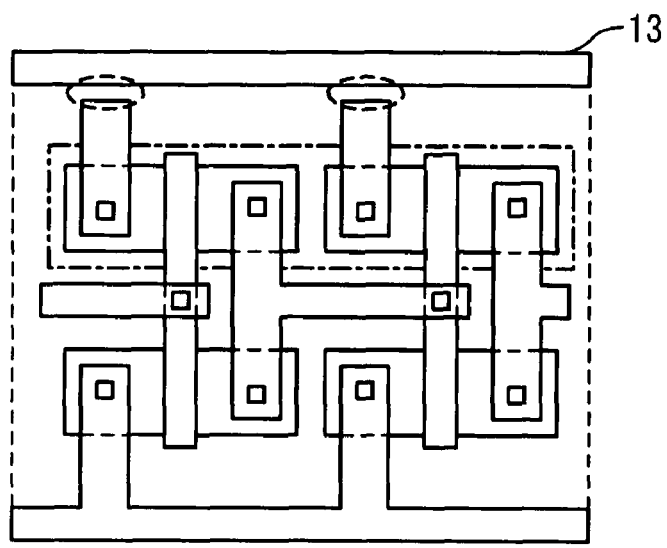

FIGS. 9A to 9D are layout patterns exemplarily showing a manufacturing method of forming the signal transfer cell 5 of the present embodiment. Referring to FIGS. 9A to 9D, the signal transfer cell 5 of the present embodiment can be formed based on the blockade-possible area cell 10 without designing a cell of a new layout pattern from the beginning. When the signal transfer cell 5 of the present embodiment is formed, the layout of the blockade-possible area cell 10 is specified at first (FIG. 9A). Next, power supply terminals of P-channel MOS transistors in the inverters 18 and 19 of the blockade-possible area cell 10 are separated from the blockade-possible area power supply line 13 (FIG. 9B).

Figure 9C:
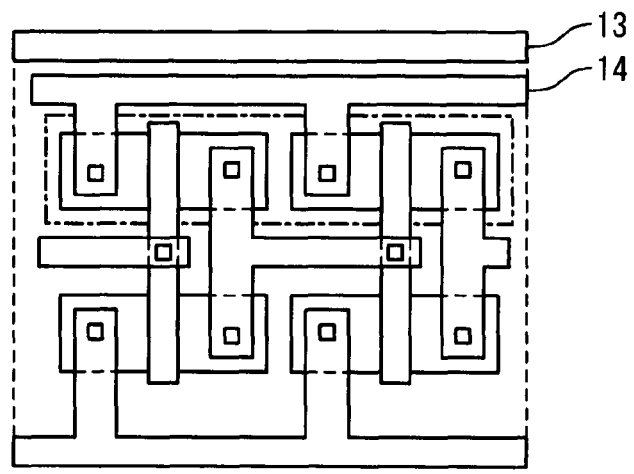
Figure 9D:
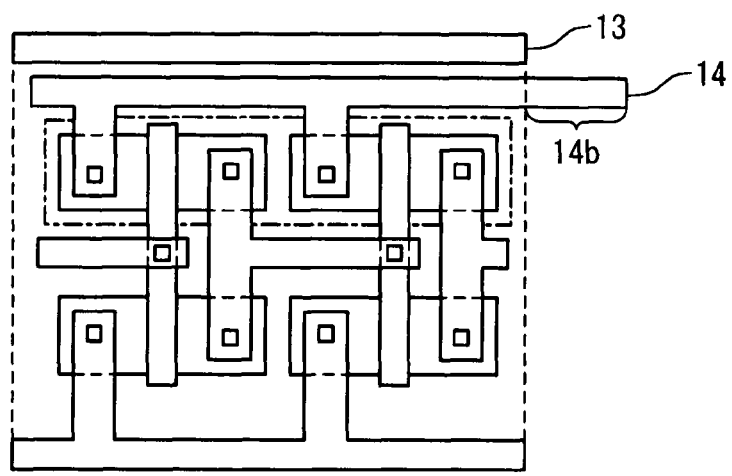

Then, the uncontrolled power supply line 14 connected to its power supply terminal is configured (FIG. 9C). Finally, when the signal formed cell 5 is arranged adjacently to the blockade-possible area cell 10, the connection terminal 14b projecting into an adjacent cell is formed. When the adjacent cell includes the aforementioned connection terminal 14c, it is preferred that the connection terminal 14b is connected to the connection terminal 14c to overlap it. In addition, as data of the signal transfer cell 5, the data having no data of the connection terminal 14c may be stored. In this case, the connection terminal 14c may be laid out after finishing arrangements of the signal transfer cell 5 and the adjacent switching cell 6, to connect the uncontrolled power supply line 14 to the switching cell 6.

As described above, the signal transfer cell 5 of the present embodiment can be formed without designing a new cell. In addition, the switching cell 6 can supply the power to the signal transfer cell 5, only by extending a line connected to the master power supply line 11 as the connection terminal 14b. Accordingly, the semiconductor integrated circuit 1 of the present embodiment can make the always-operating area and the blockade-possible area adequately operate while preventing the configuration from being complicated.

Comparative Example

Figure 10:
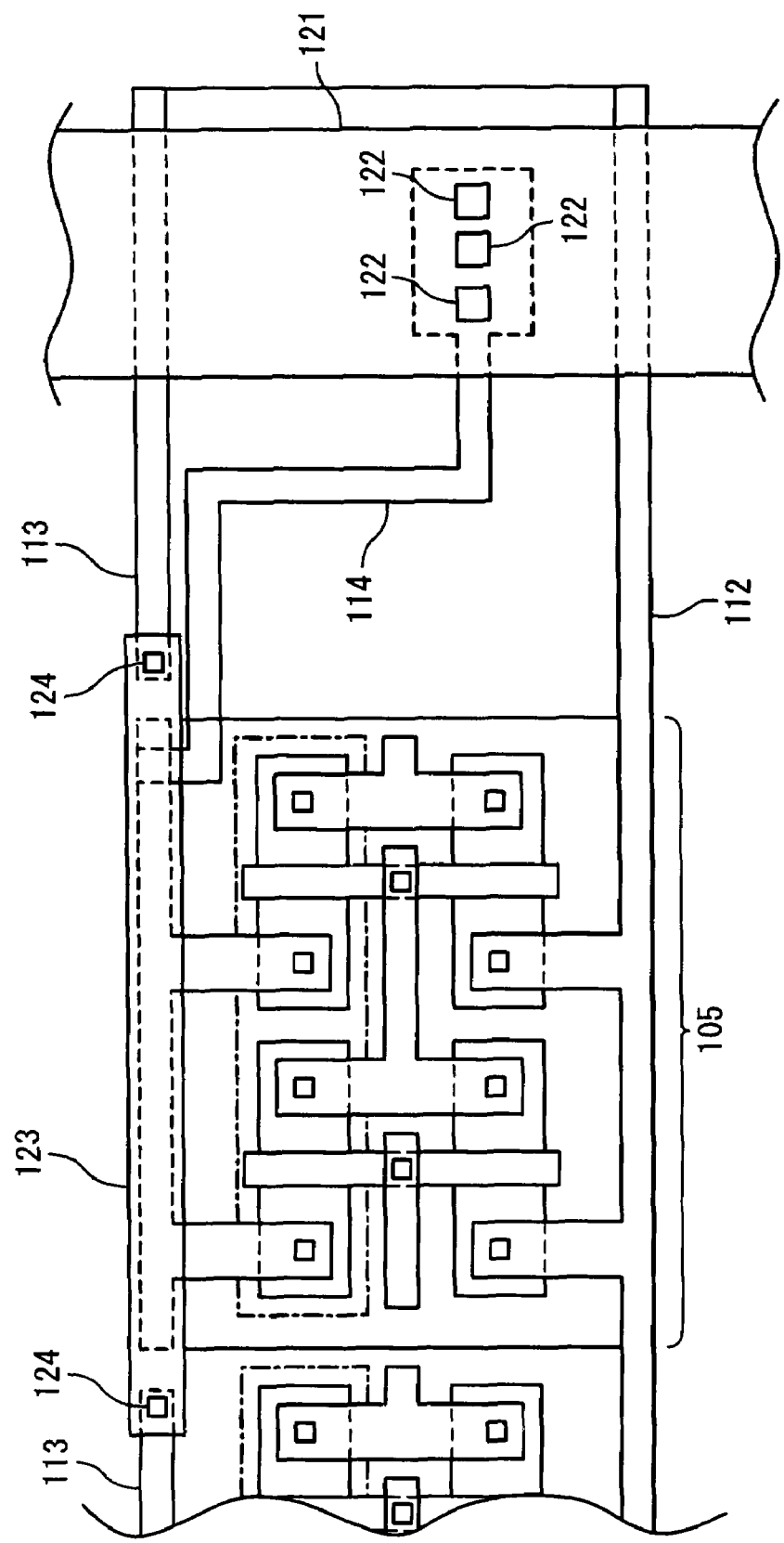
FIG. 10 is a layout pattern diagram exemplarily showing a configuration when a cell having a same configuration as that of the blockade-possible area cell 10 functions as the signal transfer cell.

FIG. 10 is a layout pattern exemplarily showing a configuration when a cell having the same configuration as that of the blockade-possible area cell 10 arranged in the blockade-possible area 3 acts as a signal transfer cell. The signal transfer cell 105 has the same configuration as that of the above-mentioned blockade-possible area cell 10. The power is supplied to the signal transfer cell 105 from a power supply line 121 arranged in an upper layer. As shown in FIG. 10, the power supply line 121 is connected to an uncontrolled power supply line 114 formed in its lower layer via a contact 122. The uncontrolled power supply line 114 is connected to the power supply line of the signal transfer cell 105.

At this moment, a blockade-possible area power supply line 113 of a cell adjacent to the signal transfer cell 105 is required to be electrically isolated from the signal transfer cell 105. In this case, to control the power supply to the cells other than the signal transfer cell 105 adequately, it is necessary to connect the blockade-possible area power supply lines 113 of the cells other than the signal transfer cell 105. Here, when the semiconductor integrated circuit 1 is made smaller in size, it is sometimes difficult to arrange a line in the same layer as the blockade-possible area power supply line 113 while avoiding the signal transfer cell 105. Therefore, as shown in FIG. 10, the blockade-possible area power supply lines 113 can be connected via connection contacts 124 by a connection power supply line 123 which is formed in an upper layer of the signal transfer cell 105. However, the arrangement of cells and lines complicates the configuration of the semiconductor integrated circuit.

As described above, the semiconductor integrated circuit 1 of the present embodiment includes the signal transfer cell 5 having a different configuration from the blockade-possible area cell 10 in order to suppress complicating of design and increasing of work steps. The signal transfer cell 5 has the connection terminal 14b, and is arranged adjacently to the switching cell 6 having the terminal connection 14c. Thus, a signal transfer circuit 5 can be formed independently from an operation of the switching cell 6 without providing extra lines.

That is to say, the operation can be continued even when the signal transfer cell 5 is arranged in the blockade-possible area 3 and the power supplied to the blockade-possible area 3 is blocked. For this reason, in the semiconductor integrated circuit 1 of the present embodiment, a signal can be adequately transferred to an operating circuit by transferring the signal via the signal transfer cell 5 even when there is a circuit block whose operation is stopped to reduce power consumption. In addition, the semiconductor integrated circuit 1 can be operated adequately by forming the switching control signal transfer cell 4 for transferring a control signal for the switching cell 6 in the similar configuration to the signal transfer cell 5.

The configuration of the present invention has been described by exemplarily showing the configuration in which the switching cell 6 is arranged between the master power supply line 11 and the blockade-possible area power supply line 13. However, the present invention is not limited to this configuration. For example, the semiconductor integrated circuit 1 may include the switching cell 6 arranged between the ground line 12 and the ground supply terminal of the blockade-possible area cell 10. In addition, even when the semiconductor integrated circuit 1 includes the switching cells 6 on the power supply side and the ground side, the above-mentioned effectiveness can be obtained.

A method of forming an always operating cell continuing to operate even when a power supply to a power supply blockade-possible area is blocked off, is achieved by specifying a basic cell, by specifying a power supply line of the basic cell and power supply electrode portions of transistors of the basic cell, by separating the power supply line and the power supply electrode portions while keeping a function of the power supply line in the power supply blockade-possible area, by connecting the separated power supply electrode portions to another power supply line, and by connecting a protruding portion of the basic cell to a power supply line of another cell.

Also, in a method of manufacturing a semiconductor integrated circuit having a power supply blockade-possible area in which power supply can be blocked off, an always operating cell is prepared from a basic cell. A switch cell is formed to have a transistor used to stop power supply to the power supply blockade-possible area. The always operating cell is arranged in the power supply blockade-possible area to operate without dependence on an operation of the switch cell.

The preparation of the always operating cell is achieved by specifying the basic cell to be arranged in the power supply blockade-possible area, by specifying a power supply line of the basic cell and an power supply electrode portion of the transistor of the basic cell, by separating the power supply line and the power supply electrode portion while keeping a function of the power supply line in the power supply blockade-possible area, by connecting the separated power supply electrode portion to another power supply line, and by connecting a protruding portion of the basic cell to a power supply line of another cell.

Although the present invention has been described above in connection with several embodiments thereof, it will be appreciated by those skilled in the art that those embodiments are provided solely for illustrating the present invention, and should not be relied upon to construe the appended claims in a limiting sense.

What is claimed is:

1. A semiconductor integrated circuit comprising:
    a cell arrangement area provided on a semiconductor substrate to allow a plurality of basis cells to be arranged;
    a basic power supply line provided in an upper layer relative to said cell arrangement area to supply a power;
    a switch cell configured to control the power supply from said basic power supply line to an inside of said cell arrangement area; and
    an always operating cell arranged in said cell arrangement area adjacently to said switch cell, and configured to receive the power from said switch cell even when said switch cell stops the power supply to said cell arrangement area.

2. The semiconductor integrated circuit according to claim 1, wherein said always operating cell comprises:

a boundary, through which said always operating cell is arranged in said cell arrangement area adjacently to a first cell; and a protruding portion formed to protrude into said first cell from said boundary, and said switch cell comprises:

a power supply line end portion connected with said basic power supply line; and a connection portion configured to connect said power supply line end portion and said protruding portion.

3. The semiconductor integrated circuit according to claim 2, wherein said switch cell is provided in said cell arrangement area, said always operating cell comprises:

a signal input terminal portion configured to receive a control signal to control an operation of said switch cell; and a signal output terminal portion connected with said switch cell to output said control signal to said switch cell, and said control signal is converted from said signal input terminal portion to said output terminal portion even when said cell arrangement area is blocked off.

4. The semiconductor integrated circuit according to claim 2, further comprising:

another cell arrangement area, in which a second cell operating when the power supply to said cell arrangement area is stopped is arranged, wherein said always operating cell is configured to transfer a predetermined signal to said second cell in said another cell arrangement area via said cell arrangement area even when the power supply to said cell arrangement area is stopped.

5. The semiconductor integrated circuit according to claim 1, wherein the always operating cell is configured to receive the power from the basic power supply such that at least a portion of said cell arrangement area continues to receive power when said switch cell stops the power supply to the cell arrangement area, and wherein the always operating cell comprises:

a boundary, through which the always operating cell is arranged in said cell arrangement area adjacently to a first cell; and a protruding portion formed to protrude into said first cell from said boundary.

6. The semiconductor integrated circuit according to claim 1, wherein said switch cell comprises:

a power supply line end portion connected with the basic power supply line; and a connection portion configured to connect at least the power supply line end portion and a portion of the always operating cell.

7. The semiconductor integrated circuit according to claim 1, wherein:

the cell arrangement area comprises the switch cell, and the always operating cell comprises:

a signal input terminal portion receiving a control signal to control an operation of said switch cell; and a signal output terminal portion connected with said switch cell to output the control signal to said switch cell.

8. The semiconductor integrated circuit according to claim 7, wherein the control signal is converted from said signal input terminal portion to said output terminal portion even when said cell arrangement area is blocked off.

9. The semiconductor integrated circuit according to claim 1, further comprising another cell arrangement area comprising a second cell operating when the power supply to the cell arrangement area is stopped.

10. The semiconductor integrated circuit according to claim 1, wherein the always operating cell transfers a predetermined signal to a second cell in another cell arrangement area via the cell arrangement area even when the power supply to said cell arrangement area is stopped.

11. A semiconductor integrated circuit comprising:

a semiconductor substrate;

a cell arrangement area provided on said semiconductor substrate to allow a plurality of basis cells to be arranged;

a basic power supply line provided in an upper layer than from said cell arrangement area;

a switch cell configured to connect said basis power supply line and power supply line end portions of a plurality of basis cells arranged in said cell arrangement area; and an always operating cell arranged in said cell arrangement area adjacently to said switch cell, wherein said switch cell blocks the power supply from said basis power supply line to said cell arrangement area in response to a control signal, and wherein said always operating cell is configured to receive the power from said switch cell without dependence on an operation of said switch cell.

12. The semiconductor integrated circuit according to claim 11, wherein said always operating cell comprises:

a boundary, through which said always operating cell is arranged in said cell arrangement area adjacently to a first cell; and a protruding portion formed to protrude into said first cell from said boundary, and said switch cell comprises:

a gate electrode configured to receive said control signal;

a first power supply line end portion connected with said basic power supply line; and a second power supply line end portion to be connected with one of said power supply line end portions; and a connection portion configured to connect said second power supply line end portion and said protruding portion.

13. The semiconductor integrated circuit according to claim 11, further comprising:

another cell arrangement area, in which a second cell operating when the power supply to said cell arrangement area is stopped is arranged, wherein said always operating cell configured to transfer a predetermined signal to said second cell in said another cell arrangement area via said cell arrangement area when the power supply to said cell arrangement area is stopped.

14. The semiconductor integrated circuit according to claim 11, wherein said always operating cell comprises:

a boundary, through which the always operating cell is arranged in the cell arrangement area adjacently to a first cell; and a protruding portion formed to protrude into said first cell from said boundary.

15. The semiconductor integrated circuit according to claim 11, wherein said switch cell comprises:

a gate electrode receiving a control signal;

a first power supply line end portion receiving power from the basic power supply line; and a second power supply line end portion receiving power from one of the power supply line end portions when a connection portion connects the second power supply line end portion and the protruding portion.

16. The semiconductor integrated circuit according to claim 11, further comprising another cell arrangement area comprising a second cell operating when the power supply to the cell arrangement area is stopped by the always operating cell transferring a predetermined signal to the second cell when the power supply to the cell arrangement area is stopped.

17. An always operating cell provided in a semiconductor integrated circuit, said always operating cell comprising:
a terminal to receive power from a switch cell even when said switch cell stops a power supply to a cell arrangement area,
wherein:
said always operating cell is arranged in a said cell arrangement area adjacently to switch cell,
said cell arrangement area is provided on a semiconductor substrate to allow a plurality of basis cells to be arranged,
a basic power supply line is provided in an upper layer in relation to said cell arrangement area to supply the power and
said switch cell is configured to control the power supply from a basic power supply line to an inside of said cell arrangement area.

18. The always operating cell according to claim 17, wherein said always operating cell has a layout pattern in which a connection section of a blockade-possible area, which said switch cell controls the power supply to, is removed from a layout pattern of a basic cell, and a basic power supply line connection portion is provided to be connectable to said basic power supply line.

19. The always operating cell according to claim 18, wherein said basic power supply line connection portion is connected to said basic power supply line due to adding a wiring pattern.

20. The always operating cell according to claim 18, wherein said basic power supply line connection portion has a protruding portion, and is connected to said basic power supply line with said protruding portion due to arranging said always operating cell in contiguity with a power supply cell for said basic power supply line.

* * * * *